United States Patent [19]
Antonov et al.

[11] Patent Number: 5,001,667
[45] Date of Patent: Mar. 19, 1991

[54] OPTICAL STORAGE DEVICE

[75] Inventors: Alexandr A. Antonov; Vyacheslav V. Petrov, both of Kiev, U.S.S.R.

[73] Assignee: Institut Problem Modelirovania V Energetike Akademii Nauk, Kiev, U.S.S.R.

[21] Appl. No.: 265,794

[22] PCT Filed: Dec. 14, 1987

[86] PCT No.: PCT/SU87/00142
§ 371 Date: Aug. 12, 1988
§ 102(e) Date: Aug. 12, 1988

[87] PCT Pub. No.: WO88/04827
PCT Pub. Date: Jun. 30, 1988

[30] Foreign Application Priority Data
Dec. 15, 1986 [SU] U.S.S.R. .............................. 4157162

[51] Int. Cl.$^5$ .............................................. G11C 13/04
[52] U.S. Cl. ........................................ 365/127; 365/120
[58] Field of Search ................ 365/127, 120, 106, 125

[56] References Cited
U.S. PATENT DOCUMENTS

| | | | |
|---|---|---|---|
| 2,994,863 | 8/1961 | Trapnell | 365/127 |
| 3,148,355 | 9/1964 | Sliter | 365/127 |
| 3,215,989 | 11/1965 | Ketchledge | 365/127 |
| 3,226,697 | 12/1965 | Fujitsubo | 365/127 |
| 4,470,137 | 9/1984 | Tago . | |
| 4,519,061 | 5/1985 | Dahneke . | |

FOREIGN PATENT DOCUMENTS
0033052 12/1983 European Pat. Off. .

OTHER PUBLICATIONS
"Mini-Micro Systems", Jun., 1984, Keith Jones.
"Doc Data Plans to Make 6,000 m-Bytes Optical Type Cassette", pp. 98, 101.

Primary Examiner—Terrell W. Fears
Attorney, Agent, or Firm—Lilling and Lilling

[57] ABSTRACT

An optical memory includes a storage for optical data carriers, a means for transferring data carriers from the storage to one or several stations for data recording or reading, a modulated electromagnetic radiation source and photodetectors which are optically connected to the carriers, and a switching unit for switching the modulated electromagnetic radiation from the source to the optical carriers and from the carriers to the photodetectors in accordance with the address of the station where a respective carrier is disposed.

3 Claims, 5 Drawing Sheets

OPTICAL STORAGE DEVICE

BACKGROUND OF THE INVENTION

1. Field of the Invention

The invention relates to means for data recording and reading and, more particularly, to optical memories or storage devices.

2. Description of the Related Art

Known in the art is an optical memory comprising a source of modulated electromagnetic radiation (gas laser), a photodetector, one working station for an optical disk data carrier as well as a library of the optical disk data carriers and a means for transferring thereof to, and from the working stations. The use of the optical disk data carrier makes it possible to provide a direct access to data and, hence, somewhat reduce the time for access to data (EP, B, 0106570).

A disadvantage of this solution resides in that the access time which comprises the time for transferring, inserting, accelerating, stopping and removing the optical disk data carrier remains too long. Another disadvantage resides in poor reliability of recording and reading since the working station is provided with only one optical head, the failure of which will make data recording and reading impossible.

Known in the art is an optical memory comprising the following optically coupled members: modulated electromagnetic radiation sources using laser diodes, photodetectors, and sixteen working stations for optical tape carriers placed in sealed cassettes each having an informational capacity of 6 Gbytes as well as a library of the tape data carriers and a means for transferring thereof to, and from, the working stations. (Mini-Macro Systems, June, 1984, Keith Jones "DOC data plans to make 6,000 M-byte optical-type cassette" pp. 98, 101).

In this memory, the time for access to data is from 1 to 10 s which results from a consecutive access to data on the tape carrier. Another disadvantage resides in poor reliability of recording and reading since each data carrier working station is provided with only one optical head, the failure of which will make recording and reading impossible.

SUMMARY OF THE INVENTION

The invention provides an optical memory which permits reduction in the time for access to data owing to a change in the order of, and simultaneous performance of, certain operations of the process of organizing the access to data being recorded or read.

This problem is solved by an optical memory in which movable optical data carriers are is placed at one or more of at least two stations by a means for transferring the optical carrier from its storage, the optical data carrier being optically coupled to at least one modulated electromagnetic radiation source and at least one photodetector. The optical storage device further comprises a switching unit for switching modulated electromagnetic radiation from the modulated electromagnetic radiation source to the optical data carriers and from the optical data carriers to the photodetector in accordance with the address of the station where a respective optical data carrier is disposed.

The switching unit of the modulated electromagnetic radiation may comprise a light beam splitter equally spaced from the optical data carriers when they are disposed at a respective station and a lens rotatable simultaneously with the light beam splitter and optically coupled thereto.

When the optical data carrier is made cylindrical, rotatable about its axis, the rotation axis of the light beam splitter is preferably disposed in parallel with the rotation axis of the optical cylindrical data carrier.

This embodiment of the optical memory improves reliability of recording and reading data and reduces the time for the access thereto.

BRIEF DESCRIPTION OF DRAWINGS

The invention will now be described with reference to specific embodiments shown in the accompanying drawings, in which.

DESCRIPTION OF THE PREFERRED EMBODIMENTS

Figure 1:
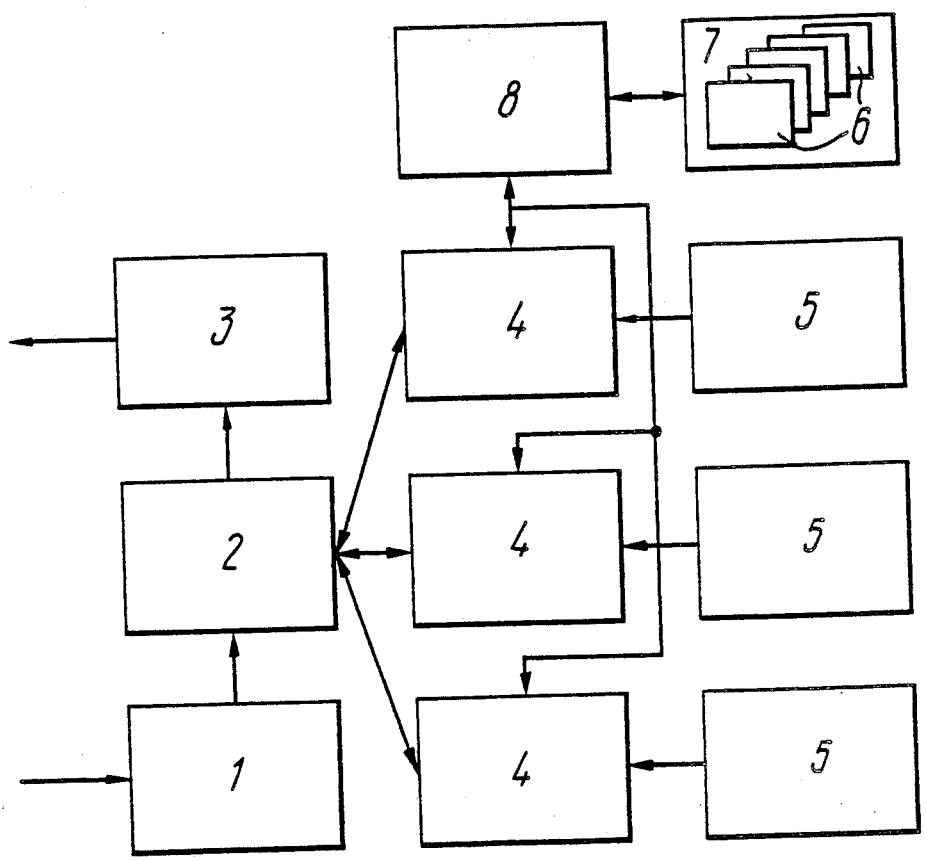
FIG. 1 shows a block diagram of an optical memory, according to the invention.

An optical memory comprises the following optically coupled members: a modulated electromagnetic radiation source 1 (FIG. 1), e.g. a solid-state or gas laser having an optical modulator or a semiconductor laser having a controlled power supply, a switching unit 2 for switching the modulated electromagnetic radiation from the modulated electromagnetic radiation source 1 to optical data carriers and from them to a photodetector 3 in accordance with the address of stations 4 at which positioning units 5 for addressing the modulated electromagnetic radiation are disposed, and optical data carriers 6, e.g. disk, tubular, tape or other carriers.

The photodetector 3 is of a known type and may comprise at least one photodiode and amplifier.

Furthermore, the optical memory comprises a storage 7 of the optical data carriers 6 and a means 8 for moving them from the storage 7 to the stations 4, and vice versa. A manipulator of any known design may be used as the means 8.

Figure 2:
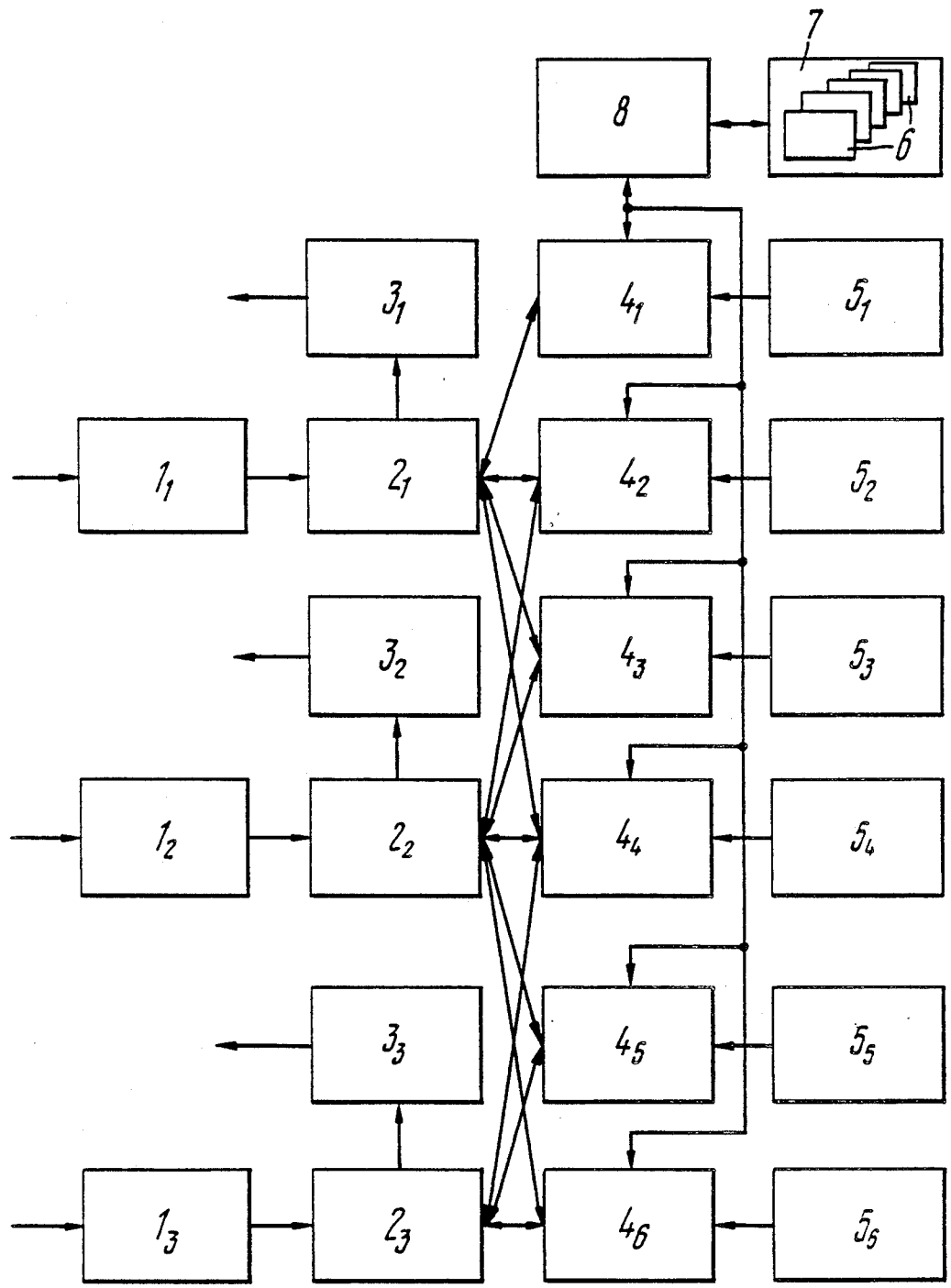
FIG. 2 shows a block diagram of another optical memory, according to the invention.

An optical memory shown in FIG. 2 comprises three modulated electromagnetic radiation sources $1_1$, $1_2$, $1_3$ and, respectively, three switching units $2_1$, $2_2$, $2_3$ for switching the modulated electromagnetic radiation from the modulated electromagnetic radiation source 1 to the optical data carriers 6 and from the optical data carriers 6 to photodetectors $3_1$, $3_2$, $3_3$, respectively. It has six stations $4_1$, $4_2$, $4_3$, $4_4$, $4_5$, $4_6$ for accommodating the optical data carriers 6 during recording data thereon or reading data therefrom. The modulated electromagnetic radiation is applied to certain stations $4_1$, $4_2$, $4_3$, $4_4$, $4_5$, $4_6$ from more than one modulated electromagnetic radiation source 1, i.e. the radiation is applied to the stations $4_2$, $4_3$ from the sources $2_1$ and $2_2$; the radiation is applied to the station $4_4$ from the sources $2_1$, $2_2$ and $2_3$; the radiation is applied to the stations $4_5$, $4_6$ from the sources $2_2$ and $2_3$. A respective positioning unit $5_1$, $5_2$, $5_3$, $5_4$, $5_5$, $5_6$ corresponds to each station $4_1$ to $4_6$.

The transfer means 8 moves the data carriers 6 from the storage 7 to the stations 4 and backwards.

Figure 3:
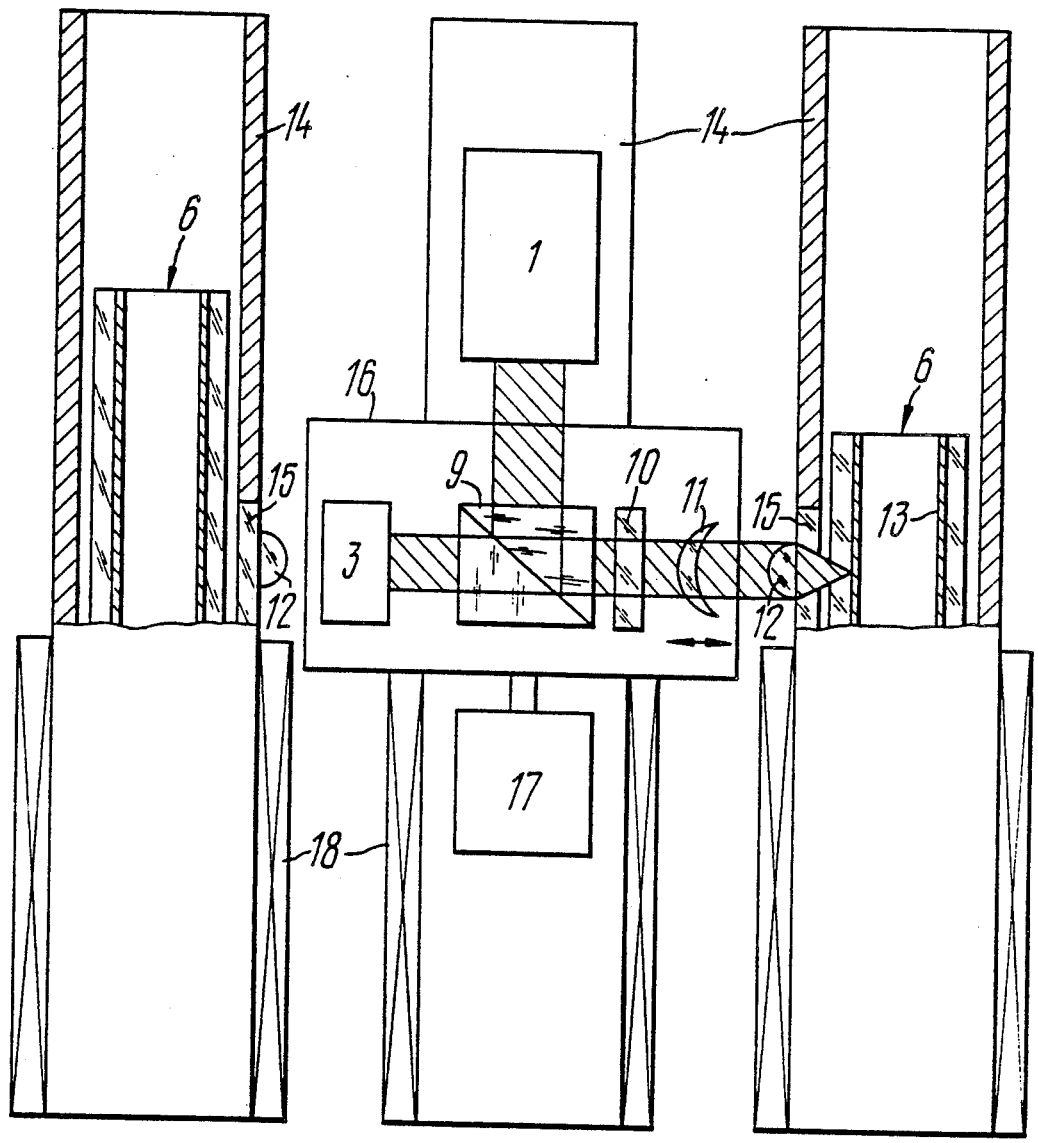
FIG. 3 is a view of a switching unit, according to the invention.

A modulated electromagnetic radiation switching unit 2 shown in FIG. 3 comprises a rotatable light beam splitter 9 having its optical input connected to the modulated electromagnetic radiation source 1 having its first optical output optically connected, through a quarter-wavelength plate 10, a movable lens 11 and a fixed lens 12, to a recording layer 13 of the cylindrical data carrier 6. The carrier 6 is enclosed in a container 14 having a transparent window 15. Another optical output of the rotatable light beam splitter 9 is connected to the photodetector 3. The abovementioned means 9, 10, 11 and 3 are disposed on a base 16 which is operatively connected to the shaft of an electric motor 17 which makes the base 16 rotate about the vertical axis of the rotatable light beam splitter 9. The optical cylindrical data carriers 6 are placed inside the containers 14 by the transfer means 8 (FIGS. 1, 2) to rotate about the axes thereof as well as move along the axis for positioning with the help of electric motors 18.

Figure 4:
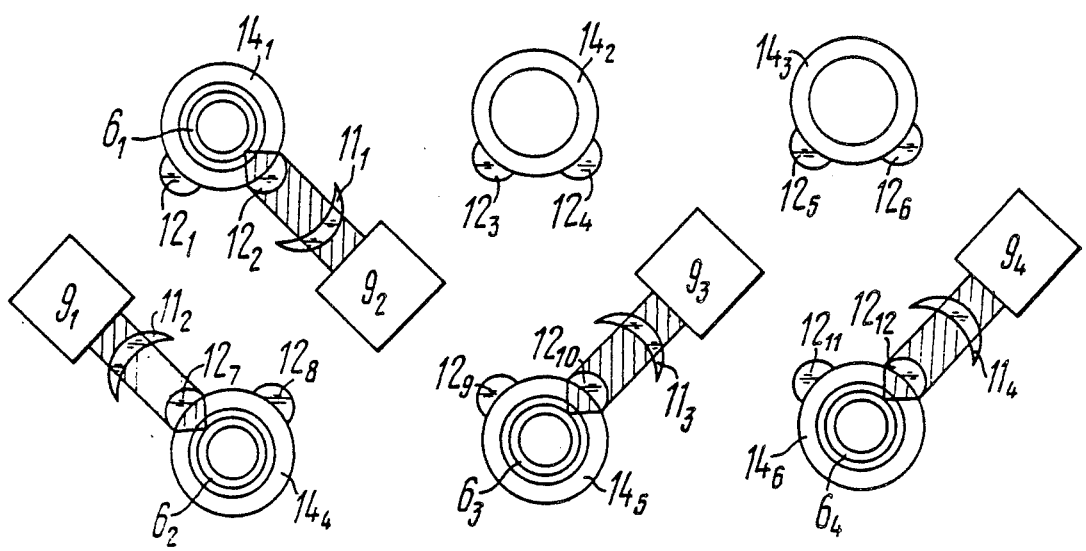
FIG. 4 is a view showing the relative three-dimensional position of rotatable light beam splitters and optical data carriers at respective stations, according to the invention.
Figure 5:
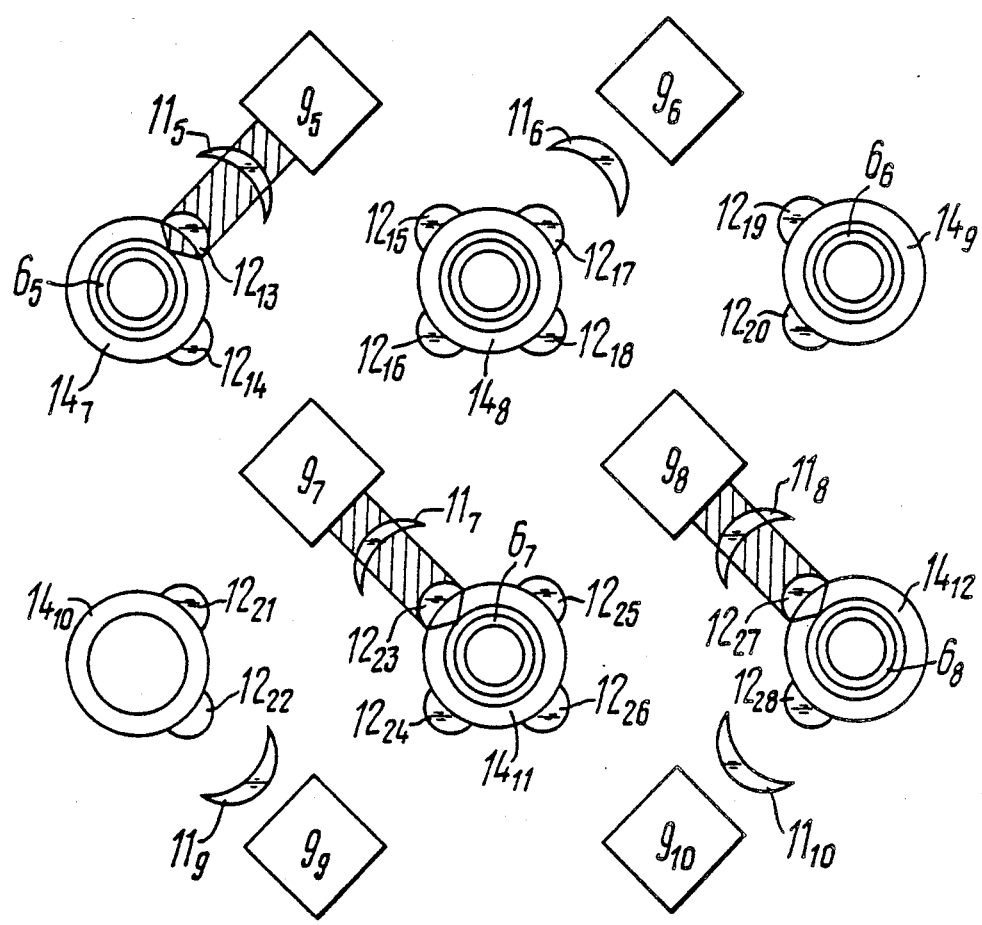
FIG. 5 is a view showing another example of a relative three-dimensional position of rotatable light beam splitters and optical data carriers mounted at respective stations.

FIGS. 4 and 5 are plan views showing embodiments of a relative position of the rotatable light beam splitters 9 with respect to the optical cylindrical data carriers 6 placed in the containers 14. In FIG. 4, the rotatable light beam splitters $9_1$, $9_2$, $9_3$ and $9_4$ are equally spaced from the containers $14_1$, $14_2$, $14_3$, $14_4$, $14_5$ and $14_6$ some of which accommodate the optical cylindrical data carriers $6_1$ to $6_4$. The cylindrical data carrier $6_1$ is placed in the container $14_1$, the carrier $6_2$ is placed in the container $14_4$, the carrier $6_3$ is placed in the container $14_5$, the carrier $6_4$ is placed in the container $14_6$. The electromagnetic radiation is applied from the outputs of the respective rotatable light beam splitters 9 to all abovementioned optical cylindrical carriers $6_1$, $6_2$, $6_3$, and $6_4$ through the respective movable lenses $11_1$, $11_2$, $11_3$ and $11_4$ and fixed lenses $12_1$, $12_2$, $12_3$, $12_4$, $12_5$, $12_6$, $12_7$, $12_8$, $12_9$, $12_{10}$, $12_{11}$ and $12_{12}$. Thus the electromagnetic radiation is applied to the optical cylindrical carrier $6_1$ from the output of the rotatable light beam splitter $9_2$ through the movable lens $11_1$ and the fixed lens $12_2$; the radiation is applied to the carrier $6_2$ from the output of the rotatable light beam splitter $9_1$, through the movable lens $11_2$ and the fixed lens $12_7$; the radiation is applied to the carrier $6_3$ from the output of the rotatable light beam splitter $9_3$ through the movable lens $11_3$ and the fixed lens $12_{10}$; the radiation is applied to the carrier $6_4$ from the output of the rotatable light beam splitter $9_4$ through the movable lens $11_4$ and the fixed lens $12_{12}$. The optical cylindrical data carriers 6 are not provided in the containers $14_2$ and $14_3$, hence, the electromagnetic radiation is not applied thereto. In FIG. 4, each container 14 accommodates two fixed lenses 12 resulting in that the optical cylindrical data carrier 6 placed therein receives electromagnetic radiation from the output of any of two neighboring rotatable light beam splitters 9 as has been mentioned above.

An optical memory shown in FIG. 5 comprises six containers $14_7$, $14_8$, $14_9$, $14_{10}$, $14_{11}$, $14_{12}$ and six rotatable light beam splitters $9_5$, $9_6$, $9_7$, $9_8$, $9_9$, $9_{10}$ having the movable lenses $11_5$, $11_6$, $11_7$, $11_8$, $11_9$, $11_{10}$. Each container $14_7$, $14_9$, $14_{10}$, $14_{12}$ has two fixed lenses 12 ($12_{13}$, $12_{14}$, $12_{19}$, $12_{20}$, $12_{21}$, $12_{22}$, $12_{27}$, $12_{28}$) disposed thereon, and each container $14_8$ and $14_{11}$ has four fixed lenses 12 ($12_{15}$, $12_{16}$, $12_{17}$, $12_{18}$, $12_{23}$, $12_{24}$, $12_{25}$, $12_{26}$). Therefore, electromagnetic radiation may be applied to the optical cylindrical data carrier $6_5$ placed in the container $14_7$ from any of the rotatable light beam splitters $9_5$, $9_7$; the radiation may be applied to the carrier 6 (FIG. 5) placed in the container $14_8$ from the rotatable light beam splitters $9_5$, $9_6$, $9_7$, $9_8$; the radiation may be applied to the carrier $6_6$ placed in the container $14_9$ from the rotatable light beam splitters $9_6$, $9_8$; the radiation may be applied to the carrier $6_7$ placed in the container $14_{11}$ from the rotatable light beam splitters $9_7$, $9_8$, $9_9$, $9_{10}$; the radiation may be applied to the carrier $6_8$ placed in the container $14_{12}$ from the rotatable light beam splitters $9_8$, $9_{10}$. However, as shown in an exemplary embodiment in FIG. 5, electromagnetic radiation is applied to the optical cylindrical data carrier $6_5$ from the rotatable light beam splitter $9_5$; the radiation is applied to the optical cylindrical data carrier $6_7$ from the rotatable light beam splitter $9_7$; the radiation is applied to the optical cylindrical data carrier $6_8$ from the rotatable light beam splitter $9_8$. The radiation is not applied to the optical cylindrical data carrier $6_6$ in the container $14_9$, i.e. the carrier has either been just prepared for processing or it has already been processed and is to be removed to the storage 7 (FIGS. 1, 2).

There may be other embodiments of the optical memory according to the invention which differ in the type of the optical data carrier, relative postion of the electromagnetic radiation switching units and the optical data carriers, design of the modulated electromagnetic radiation switching unit and other features which would make it possible to carry out the task without deviating from the spirit and scope of the present invention.

The optical memory functions as follows.

In the recording mode, radiation of the electromagnetic radiation sources 1 is modulated in intensity or otherwise under the action of the signal being recorded. This radiation is directed by the modulated electromagnetic radiation switching unit 2 to the optical data carrier 6 which is located at the station 4 and to which rotation is beforehand imparted up to the working speed and which is appropriately addressed with respect to the beam by the positioning unit 5. Simultaneously, the transfer means 8 remove the optical carriers 6 from other stations 4 to the storage 7 of the optical data carriers 6 after their use is completed, and other optical carriers being prepared for data recording/reading are delivered to the stations 4 from the storage 7. Therefore, in the memory according to the invention, the access time is only determined by the switching time of the modulated electromagnetic radiation switching unit 2.

In the optical memory, operation of the optical data carriers 6 located at the stations 4 with various modulated electromagnetic radiation sources 1 is possible (FIGS. 2, 4, 5). This is done (FIGS. 4, 5) by installing several fixed lenses 12 optically coupled to the outputs of several modulated electromagnetic radiation switching units 2 in the transparent windows 15 of the container 14 for the carrier 6 located at the station 4. As a result, with the failure of, e.g., one modulated electromagnetic radiation source 1 or one modulated radiation switching unit 2, their functions may be transferred to another optical channel connected to the same station 4, which makes it possible to substantially improve reliability of the memory functioning.

In the reading mode, the modulated electromagnetic radiation source 1 radiates a beam of a constant intensity which is modulated at the station 4 in intensity of information recorded on the carrier 6. In the photodetector 3, an optical signal is converted into an electrical reproduction signal.

The modulated electromagnetic radiation switching unit 2 shown in FIG. 3 functions as follows.

A beam which is radiated by the electromagnetic radiation source 1 and which is modulated in the recording mode and is not modulated in the reading mode is directed by the rotatable light beam splitter 9 which is rotated by the electric motor 17, at one of its neighboring stations 4 where the rotating positioned cylindrical data carrier 6 is mounted. The beam reflected from the rotatable light beam splitter 9 goes through the quarter-wavelength plate 10, the movable lens 11 by means of which the automatic focusing thereof is carried out, and the fixed lens 12 located in the transparent window 15 of the body of the container 14 in which the movable optical cylindrical data carrier 6 is accommodated. Rotation and positioning of the optical cylindrical data carrier 6 by way of axial movement are provided by the biaxial electric motor 18. The beam reflected from the movable optical cylindrical carrier 6 goes for the second time through the quarter-wavelength plate 10 so as to turn its plane of polarization by 90° with respect to the initial direction and thus go through the rotatable light beam splitter 9 to the photodetector 3.

Other embodiments of the memory according to the invention are possible which may differ in the number of the optical heads connected to the working stations, ways in which the connection is carried out, the type of the optical switch being used and other features.

The optical memory according to the invention has a short access time of about 1 s with the informational capacity of the optical cylindrical data carriers of 200 to 500 Mbyte. The use of the standby optical channels for recording or reading will make it possible to improve reliability of the memory functioning.

This invention can be used as external computer memories, particularly to organize data banks.

We claim:

1. An optical memory, comprising:
   a plurality of work stations;
   a plurality of replaceable, movable, optical carriers;
   a storage for said carriers;
   a means for transferring said carriers between a storage position in said storage, and a working position at one of said plurality of work stations;
   a plurality of sources of modulated, focused laser radiation, said plurality of sources of modulated, focused laser radiation having at least one photodetector, said carriers being optically coupled with at least one of said plurality of radiation sources when said carriers are in said working position;
   at least one unit for switching modulated focused laser radiation between individual work stations of said plurality of work stations, said switching unit being optically coupled with said plurality of radiation sources and with said photodetector;
   a plurality of positioning means for addressing and imparting working speed rotation to said carriers when said carriers are in said working position, said positioning means being provided for respective work stations of said plurality of work stations, said plurality of work stations being arranged in a pattern such that each work station is equally distant from at least one of said switching units.

2. An optical memory as claimed in claim 1, wherein said switching unit comprises a rotatable light beam splitter equally spaced from said carriers when said carriers are in said working position, and a rotatable lens optically coupled with said light beam splitter, said lens and said splitter being rotatable simultaneously.

3. An optical memory as claimed in claim 2, wherein said carriers are cylindrical in shape and have a rotation axis, and wherein said light beam splitters also have a rotation axis, said rotation axis of said beam splitter being parallel with said rotation axis of said cylindrical carrier when said cylindrical carrier is in said working position.

* * * * *